United States Patent
Herrmann et al.

(10) Patent No.: US 9,233,653 B2
(45) Date of Patent: Jan. 12, 2016

(54) FASTENER FOR FASTENING AND/OR TEMPORARILY FIXING A COMPONENT ON A RETAINER PROVIDED WITH AN OPENING, AS WELL AS A COMPONENT HAVING A FASTENER

(75) Inventors: Alexander Herrmann, Reutlingen (DE); Antonio Bruna Fernandez, Ciudalcampo (ES); Wolfgang Woernle, Neustetten (DE); Matthias Ludwig, Moessingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 817 days.

(21) Appl. No.: 12/227,507

(22) PCT Filed: May 30, 2007

(86) PCT No.: PCT/EP2007/055226
§ 371 (c)(1),
(2), (4) Date: Aug. 6, 2009

(87) PCT Pub. No.: WO2007/144260
PCT Pub. Date: Dec. 21, 2007

(65) Prior Publication Data
US 2009/0300893 A1    Dec. 10, 2009

(30) Foreign Application Priority Data

Jun. 16, 2006 (DE) .......................... 10 2006 027 751

(51) Int. Cl.
*A44B 21/00* (2006.01)
*B60R 16/02* (2006.01)
(Continued)

(52) U.S. Cl.
CPC ............. *B60R 16/0215* (2013.01); *B60R 11/02* (2013.01); *B60R 19/483* (2013.01);
(Continued)

(58) Field of Classification Search
CPC .. B60R 16/0215; B60R 19/483; B60R 11/02; B60R 2011/0059; Y10T 24/45262; F16B 21/088
USPC .................... 24/595.1, 297, 458, 453, 581.11; 403/397; 411/508, 527, 523, 260; 296/1.08, 146.7
See application file for complete search history.

(56) References Cited

U.S. PATENT DOCUMENTS 715,891 A * 12/1902 Somerby ........................ 411/260
3,803,670 A *  4/1974 Johnson ........................ 411/508
(Continued)

FOREIGN PATENT DOCUMENTS

DE    29519083     1/1996
DE    19517676    11/1996
(Continued)

OTHER PUBLICATIONS

Atsuhiko Yamanaka, Toshihiro Kashima, and Kenji Hosoyama Coil Bobbin Composed of High-Strength Polyethylene Fiber Reinforced Plastics for a Stable High-Field Superconducting Magnet IEEE Transactions on Applied Superconductivity, vol. 11, No. 3, Sep. 2001.*

*Primary Examiner* — Robert J Sandy
*Assistant Examiner* — Louis Mercado
(74) *Attorney, Agent, or Firm* — Kenyon & Kenyon LLP

(57) ABSTRACT

A fastener for fastening and/or temporarily fixing a component on a retainer provided with an opening, having two flexible catch pins which are situated at a distance from one another and are each provided with catch lugs in the proximity of their free ends, which project beyond opposing exterior sides of the catch pins and engage behind an edge of the opening after they pass through the opening of the retainer. It is provided that the two catch pins are situated in recesses of a projection.

17 Claims, 4 Drawing Sheets

(51) Int. Cl.
  *B60R 11/02* (2006.01)
  *B60R 19/48* (2006.01)
  *F16B 21/08* (2006.01)
  *H05K 5/00* (2006.01)
  *B60R 11/00* (2006.01)

(52) U.S. Cl.
  CPC ............ *F16B21/088* (2013.01); *H05K 5/0073* (2013.01); *B60R 2011/0059* (2013.01); *B60R 2011/0061* (2013.01); *B60R 2011/0075* (2013.01); *Y10T 24/45262* (2015.01)

(56) References Cited

U.S. PATENT DOCUMENTS

| | | | | |
|---|---|---|---|---|
| 4,782,562 A * | 11/1988 | Yuta | ............................. | 24/297 |
| 4,865,505 A * | 9/1989 | Okada | ............................. | 411/512 |
| 5,145,076 A * | 9/1992 | Murphy et al. | ............... | 213/155 |
| 5,228,816 A * | 7/1993 | Boville | ............................. | 411/340 |
| 5,326,082 A * | 7/1994 | Ecktman et al. | ............ | 267/64.27 |
| 5,384,940 A * | 1/1995 | Soule et al. | ..................... | 24/453 |
| 5,592,720 A * | 1/1997 | Sasakawa et al. | ............... | 24/453 |
| 5,945,606 A | 8/1999 | Tokunaga et al. | | |
| 6,474,921 B1 * | 11/2002 | Gordon | ............................. | 411/508 |
| D500,245 S * | 12/2004 | Okada | ............................. | D8/382 |
| 7,019,215 B2 | 3/2006 | Arai | | |
| 7,036,779 B2 | 5/2006 | Kawaguchi et al. | | |
| D566,534 S * | 4/2008 | Okada | ............................. | D8/382 |
| 2003/0016916 A1 * | 1/2003 | Allen et al. | ..................... | 385/55 |
| 2004/0244158 A1 * | 12/2004 | Awakura et al. | ................. | 24/458 |
| 2005/0244250 A1 | 11/2005 | Okada et al. | | |
| 2011/0272547 A1 * | 11/2011 | Gotou et al. | ............... | 248/224.8 |

FOREIGN PATENT DOCUMENTS

| | | |
|---|---|---|
| DE | 10 2005 018 833 | 1/2006 |
| DE | 102004035805 | 4/2006 |
| EP | 0116013 | 8/1984 |
| EP | 1 291 534 | 3/2003 |
| EP | 1 387 091 | 2/2004 |
| EP | 1647424 | 4/2006 |
| GB | 213716 | 4/1924 |
| JP | 5-44713 | 2/1993 |
| JP | 9-32822 | 2/1997 |
| NL | 1027731 | 6/2006 |

\* cited by examiner

FASTENER FOR FASTENING AND/OR TEMPORARILY FIXING A COMPONENT ON A RETAINER PROVIDED WITH AN OPENING, AS WELL AS A COMPONENT HAVING A FASTENER

FIELD OF THE INVENTION

The present invention relates to a fastener for fastening and/or temporarily fixing a component, in particular an electronic component, on a retainer provided with an opening, and in particular for fixing and/or temporarily fixing a sensor or electronic control unit on a motor vehicle body part, provided with an opening, as well as a component, in particular an electronic component, which is intended for fastening on a retainer, provided with an opening, using at least one such fastener.

BACKGROUND INFORMATION

In the past, electronic components, such as acceleration sensors or electronic control units of motor vehicles, which had to be mounted in a predefined position or orientation, were typically fastened with the aid of two or more screws which were screwed through parallel cylindrical steel sleeves inserted in a plastic housing of the component into corresponding screw holes of a retention plate of the vehicle body used for fastening. For these components, the housing was additionally frequently provided with a molded plastic pin, which was inserted into a corresponding additional hole of the retention plate for the purpose of temporarily fixing the components during the mounting operation, but only fulfilled a subordinate function for the duration of the mounting operation.

Because fastening electronic components of this type using a single screw has been increasingly requested for reasons of cost, the housing of the electronic components has been provided with one or two more robust molded plastic pegs in the place of the plastic pin only used for temporary fixing, which were inserted into complementary holes of the retainer before the screws were screwed into the screw hole, to ensure defined positioning of the component in relation to the retainer and prevent twisting of the component during tightening of the screws.

Recently, it has additionally been requested that the electronic components be engaged with the retainer before the screws are screwed in to allow one-handed mounting of the components. For this catch function, the plastic pegs molded onto the housing, which have only been used as a positioning aid and antirotation device up to this point, may be replaced by fastening clips, as are already used in the motor vehicle sector for other purposes, for example, for fastening door internal panels or similar components. These fastening clips typically have two parallel flexible catch pins situated at a distance from one another and projecting beyond the component, whose free ends are provided with projecting catch lugs on their exterior sides facing away from one another and are pressed together as the catch lugs pass through an appropriately dimensioned opening, before the catch lugs engage behind an edge of the opening on diametrically opposing points after their passage through the opening.

However, the use of fastening clips of this type has disadvantages. Firstly, fastening clips of this type have a relatively low drop resistance, so that one or both catch pins commonly break off as a result of shocks or impacts during transport and mounting, resulting in either the entire electronic component becoming unusable or at least its mounting being made significantly more difficult. Secondly, fastening clips of this type have lower positioning precision than rigid pegs because of the elastic flexibility and the smaller cross-sectional dimensions of the catch pins. Finally, their function as an antirotation device may also be impaired if an excessively high torque is exerted on the component as the screws are tightened, which may result in shearing off of one or even both catch pins of the fastening clip as a result of the smaller cross-sectional dimensions of the catch pins in comparison to rigid pegs.

Proceeding therefrom, the exemplary embodiments and/or exemplary methods of the present invention is based on the objective of improving a fastener of the type cited at the beginning in such a way that it has greater drop and shear resistance and ensures greater positioning precision during mounting.

SUMMARY OF THE INVENTION

This objective is achieved according to the exemplary embodiments and/or exemplary methods of the present invention in that the catch pins are situated in one or two recesses of a projection which projects beyond the electronic component in particular and may extend on both sides of the catch pins to their opposing exterior sides in each case, so that only the catch lugs of the catch pins project beyond an external outline of the projection, while the remaining part of the catch pins is housed within the recess or recesses largely protected from shocks and impacts.

The rigid projection thus has a protective function on the one hand, in that it not only prevents damage to the catch pins as a result of shocks or impacts during transport, but also prevents them from being sheared off as a result of the action of an excessive torque between the electronic component and the retainer as the screw is tightened, and may additionally also assume a positioning function if, according to a further exemplary embodiment of the present invention, it has a cross section adapted to the opening cross section of the opening on both sides of the catch pins.

The opening may have the shape of a short oblong hole having two semicircular limiting wall sections, whose radius of curvature corresponds to the radius of curvature of two rounded peripheral surfaces of parts of the projection situated on both sides of the catch pins, as well as two linear limiting wall sections situated between the rounded limiting wall sections, which lie opposite to the catch lugs of the catch pins. Alternatively, the opening may have other shapes, however, such as oval.

A further exemplary embodiment of the present invention provides that the catch pins are situated in the recesses in such a way that only the catch lugs project beyond an external outline of the projection, so that the catch lugs may not break off if the component drops down unintentionally.

To prevent the catch pins from bending excessively when the fastener is inserted into the opening of the retainer, the interior sides of the catch pins facing one another are expediently situated at a distance from adjacent limiting faces of the recesses so that the catch pins may bend sufficiently far into the recesses that their catch lugs may slide through the opening, but are not able to bend over more substantially. For this purpose, the parts of the projection situated on both sides of the catch pins may be connected by a web situated between the catch pins, whose opposing exterior sides are used as a stop for the adjacent interior sides of the catch pins and prevent them from bending excessively. In addition, the web increases the stability of the projection and thus also the drop resistance of the fastener.

To make it easier to insert the projection into the opening, the projection expediently has a tapered free end, the parts situated on both sides of the catch pins expediently being delimited on their free ends by faces in the form of spherical segments or pyramids.

Each of the two recesses advantageously extends over the entire length of the projection, their cross-sectional shape expediently being adapted to the cross-sectional shape of the catch pins situated in the recess, but having somewhat larger dimensions, so that the catch pin may bend unobstructed within the recess enough that it is possible for the catch lug to pass through the opening of the retainer.

To make it easier to manufacture a mold for molding the housing of the electronic component from a plastic material, the projection is expediently mirror symmetric to a plane parallel to the exterior and/or interior sides of the catch pins and/or mirror symmetric to a central plane of the two catch pins perpendicular thereto. The plastic material of the housing may be a fiber-reinforced plastic material and expediently contains at least 20% and may contain 30% glass fibers, to thus further improve the fracture and shear resistance of the projection and the catch pins.

The exemplary embodiments and/or exemplary methods of the present invention is explained in greater detail hereafter in an exemplary embodiment on the basis of the associated drawings.

DETAILED DESCRIPTION

Figure 1:
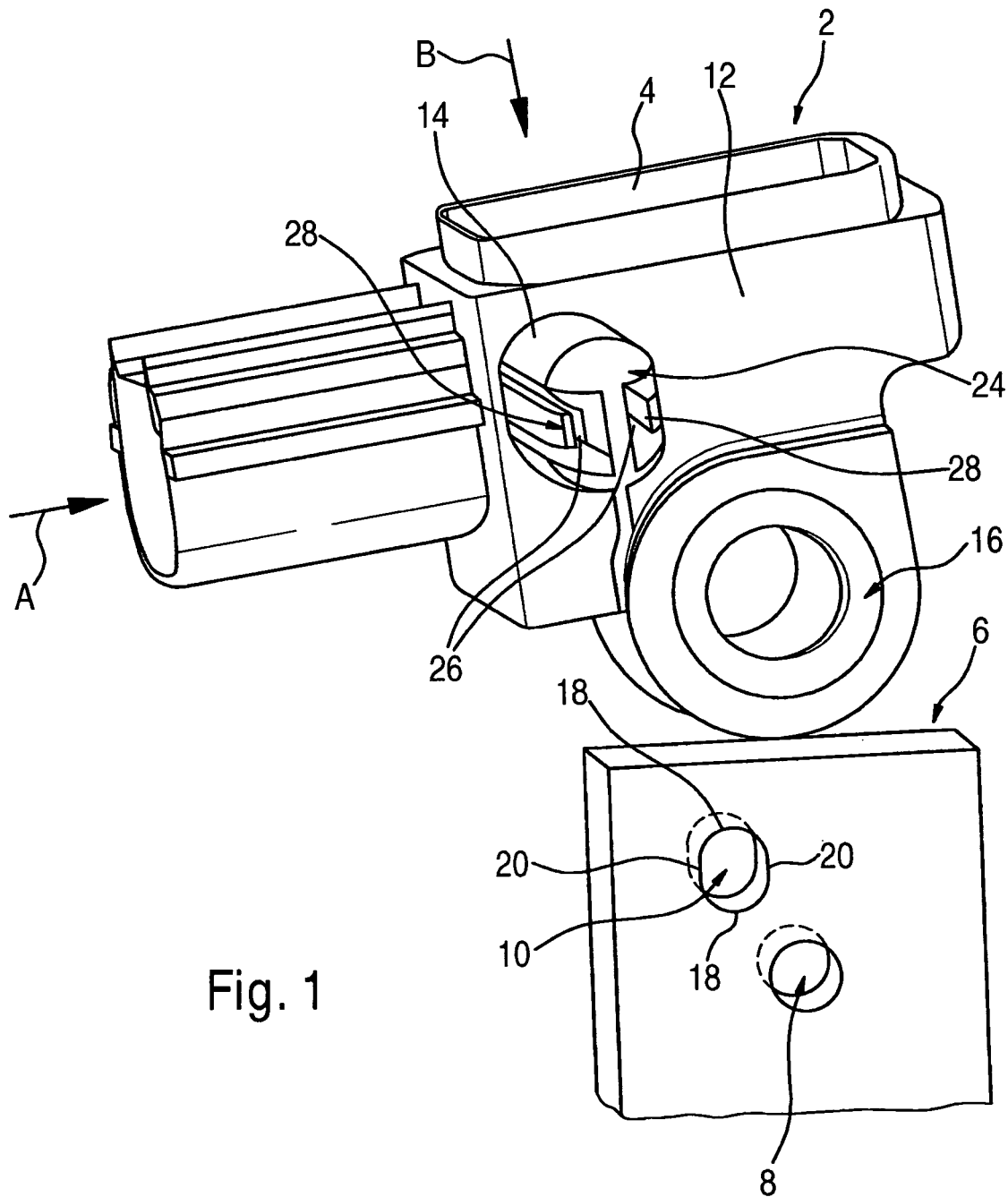
FIG. 1 shows a perspective view of a plastic housing of an acceleration sensor of a motor vehicle having a fastener according to the present invention as well as a retention plate used for mounting the housing.

Plastic housing 2 shown in FIG. 1 is used for receiving an acceleration sensor (not shown) of a motor vehicle, which is inserted through an upper installation opening 4 into housing 2. After installation opening 4 is closed using a cover (not shown), housing 2 having the acceleration sensor is mounted in a predefined orientation in relation to the motor vehicle on a retention plate 6, which forms a part of a body of the motor vehicle and is provided with two punched-out passage openings 8, 10, of which opening 8 has a circular opening cross section and opening 10 has a noncircular opening cross section.

For mounting on retention plate 6, housing 2 has a fastener 14 projecting beyond a wide lateral face 12, which is clipped into opening 10 of retention plate 6, as well as a cylindrical steel sleeve 16, molded into housing 2 during the manufacturing of housing 2 by injection molding of a plastic reinforced with 30% glass fibers and thus integrally connected to housing 2, which is flush with opening 8 of retention plate 6 after fastener 14 is clipped into opening 10, so that a self-tapping fastening screw (not shown) having a cylindrical shaft part may be screwed using one hand through steel sleeve 16 into opening 8, i.e., without housing 2 of the acceleration sensor, which is fixed in relation to retention plate 6 using fastener 14, having to be held in place using the other hand.

To allow this, on the one hand the center-to-center distance of both openings 8, 10 corresponds to the distance between a central axis of steel sleeve 16 and a central axis of fastener 14 parallel thereto. On the other hand, fastener 14 has an outline adapted to the opening cross section of opening 10, so that it may only be inserted into opening 10 in a predetermined orientation, in which steel sleeve 16 comes to rest precisely in front of opening 8 of retention plate 6.

In the specific embodiment shown in the drawing, opening 10 is formed by a short oblong hole, in which two semicylindrical limiting wall sections 18 are connected by two diametrically opposing short flat limiting wall sections 20. Fastener 14 has an outline complementary thereto, as shown best in FIG. 4, this outline comprising two opposing partial cylindrical peripheral surface sections 22, which are congruent to limiting wall sections 18 of opening 10, but extend over an arc angle that is slightly less than 180°.

Alternatively thereto, however, two fasteners (not shown) used for clipping into the openings of the retention plate may be provided at a distance from one another and from steel sleeve 16 on housing 2 of the acceleration sensor, in which case the two fasteners and the associated openings may also be provided with a circular outline and/or opening cross section.

Fastener 14 shown in the drawing essentially includes a projection 24 which is molded onto housing 2 and projects beyond wide lateral face 12, and two elastically flexible catch pins 28, which are situated at a distance from one another in lateral recesses 26 of projection 24 and also are molded onto housing 2 while projecting beyond it.

While catch pins 28 are used for clipping into opening 10 and thus for latching housing 2 on retention plate 6, projection 24 is firstly used as a protection for catch pins 28 before mounting, which are housed well protected from shocks and impacts in recesses 26 of projection 24, secondly as a positioning aid during the mounting of housing 2, in that it positions steel sleeve 16, as described above, precisely in front of opening 8 of retention plate 6, and thirdly as an antirotation device, in that it prevents housing 2 from twisting in relation to retention plate 6 if a torque is applied to housing 2 in relation to retention plate 6 as the fastening screw is screwed in.

Each catch pin 28 has a shaft part 30 having a square or rectangular cross section and a free end implemented as a catch hook, which is formed by a catch lug 32 projecting beyond the exterior side of shaft part 30 of each catch pin 28. After they pass through opening 10, catch lugs 32 of both catch pins 28 engage behind its edge facing away from housing 2 in the area of both limiting wall sections 20 in FIG. 1. To make it easier to insert catch pins 28 into opening 10, catch lugs 32 are provided in a known way with insertion bevels 34. The catch lugs are slightly beveled at 35 on their rear side facing housing 2.

Figure 2:
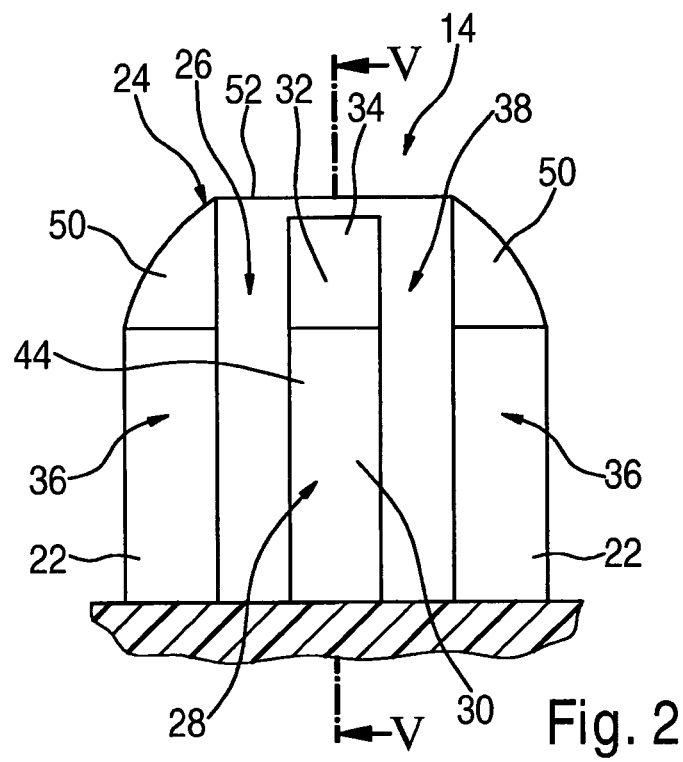
FIG. 2 shows a side view of the fastener in the direction of arrow A in FIG. 1.
Figure 3:
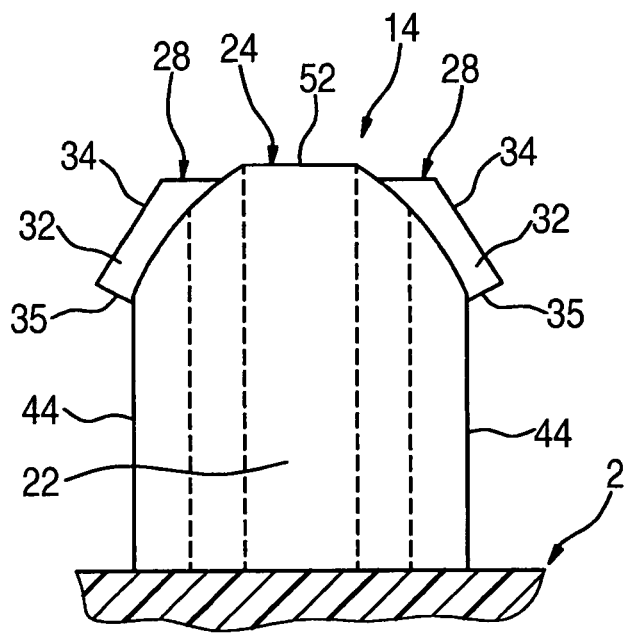
FIG. 3 shows a side view of the fastener in the direction of arrow B in FIG. 1.
Figure 4:
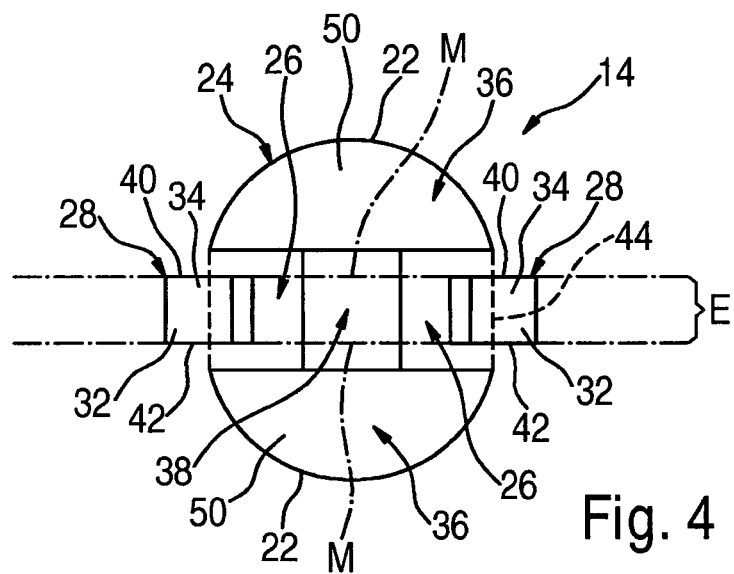
FIG. 4 shows a frontal side view of the fastener.

As shown best in FIGS. 2 and 4, projection 24 includes two parts 36 which are situated at a distance from one another on both sides of catch pins 28, have a cross section in the shape of a circular segment, and are connected to one another in one piece by a web 38 having a rectangular cross section situated in the middle between catch pins 28. Both parts 36 and web 38 together delimit both recesses 26, which are open toward opposite sides, extend over the entire length of projection 24, and have a rectangular cross section, whose cross-sectional dimensions are greater than the cross-sectional dimensions of catch pins 28.

As already specified, projection 24 is provided in the area of parts 36 with partial cylindrical peripheral surface sections 22, whose central axes M lie at a distance from one another, corresponding to the width of limiting wall parts (sections) 20 of opening 10, in two parallel planes E spanned by adjacent flat lateral faces 40, 42 of both catch pins 28, so that flat exterior sides 44 of shaft parts 30 of catch pins 28 come to rest flatly against their limiting wall sections 20 after fastener 14 is inserted into opening 10, when catch lugs 32 engage behind the edge of opening 10 facing away from housing 2 and/or the wide lateral face of retention plate 6 facing away from housing 2.

Figure 5:
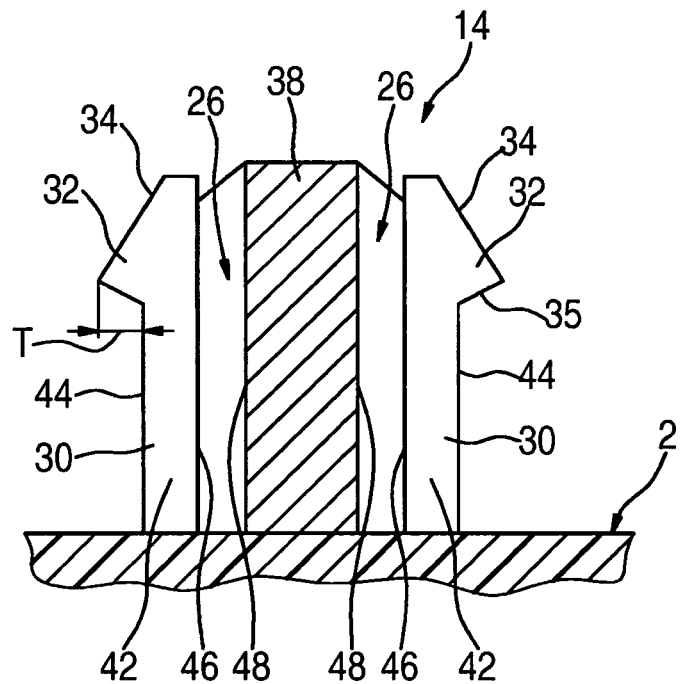
FIG. 5 shows a sectional view of the fastener along line V-V in FIG. 2.
Figure 6:
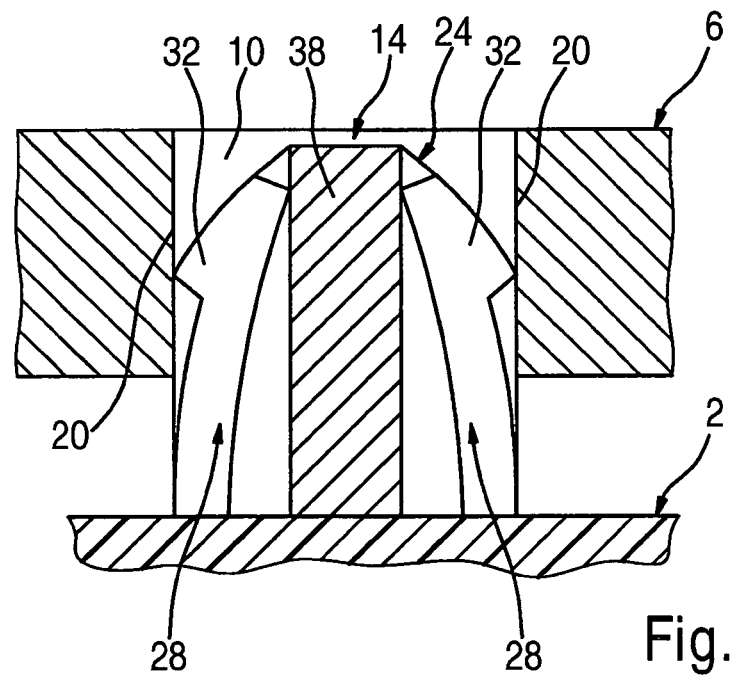
FIG. 6 shows a view corresponding to FIG. 5, but during the passage of the fastener through an opening of the retention plate.
Figure 7:
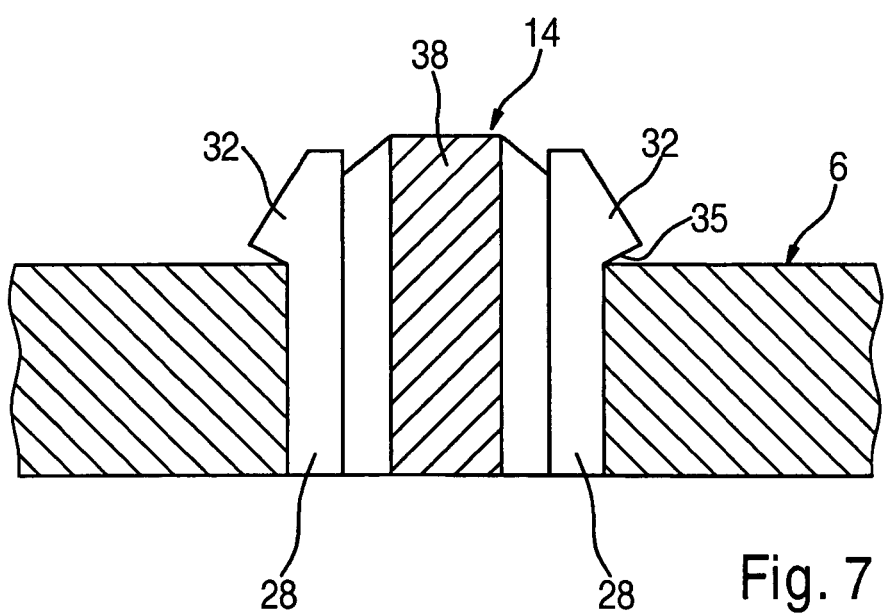
FIG. 7 shows a view corresponding to FIG. 5, but after the passage of the fastener through the opening of the retention plate.

The distance between interior sides 46 (FIG. 5) of catch pins 28 and adjacent limiting surfaces 48 of web 38 approximately corresponds to depth T of catch lugs 32, so that interior sides 46 of catch pins 28 have a slight spacing from opposing flat limiting surfaces 48 of web 38 in the area of their free ends when projection 24 passes through opening 10 as fastener 14 is clipped into the opening, as shown in FIG. 6, the tips of catch lugs 32 sliding along limiting wall sections 20. In the case in which projection 24 is tilted in relation to opening 10 as it is inserted therein, the free end of catch pin 28 which is bent more strongly by the tilting stops against adjacent limiting surface 48 of web 38, so that it is prevented from bending excessively.

As shown best in FIG. 4, fastener 14 is mirror symmetric to a plane running through central axes M of peripheral surface sections 22 as well as a plane perpendicular thereto in the center between both central axes M.

To make it easier to insert projection 24 into opening 10, projection 24 has a tapered free end which is formed by two rounded front ends 50 of both parts 36 in the shape of spherical segments and a flat front end 52 of web 38.

What is claimed is:

1. A fastener for fastening or temporarily fixing a component on a retainer provided with an opening, comprising:
    two flexible catch pins situated at a distance from one another, each of the catch pins being provided with catch lugs in a proximity of their free ends, which project beyond opposing exterior sides of the catch pins and engage behind an edge of the opening after passing through the opening of the retainer,
    wherein the catch pins are situated in recesses of a projection, the recesses defined at least by portions of the projection that extend on both sides of the catch pins, the opening is non-circular, and the fastener having an outline complementary to the opening,
    wherein a sleeve is inserted into a housing of the component at a distance from the fastener and is used for a fastening screw which is also used for fastening to the retainer.

2. The fastener of claim 1, wherein the catch pins are situated in the recesses so that only the catch lugs project beyond an external outline of the projection.

3. The fastener of claim 1, wherein interior sides of the catch pins facing one another are situated at a distance from adjacent limiting surfaces of the recesses which slightly exceeds a depth of the catch lugs.

4. The fastener of claim 1, wherein the projection on both sides of the catch pins has a cross section adapted to the cross section of the opening.

5. The fastener of claim 1, wherein portions of the projection situated on both sides of the catch pins are delimited by rounded peripheral surfaces.

6. The fastener of claim 1, wherein portions of the projection situated on both sides of the catch pins are connected by a web.

7. The fastener of claim 1, wherein the projection has a tapered free end.

8. The fastener of claim 1, wherein the recesses extend over an entire length of the projection.

9. The fastener of claim 1, wherein the projection is mirror symmetric to at least one of (i) a plane parallel to exterior, (ii) interior sides of the catch pins, and (iii) and to a central plane of the two catch pins.

10. The fastener of claim 1, wherein the opening is shaped as an oblong circle.

11. The fastener of claim 1, wherein the opening is shaped as an oval.

12. An electronic component, comprising:
    at least one fastener for fastening or temporarily fixing a component on a retainer provided with an opening, including:
        two flexible catch pins situated at a distance from one another, each of the catch pins being provided with catch lugs in a proximity of their free ends, which project beyond opposing exterior sides of the catch pins and engage behind an edge of the opening after passing through the opening of the retainer,
        wherein the catch pins are situated in recesses of a projection, the recesses defined at least by portions of the projection that extend on both sides of the catch pins, the opening is non-circular, and the fastener having an outline complementary to the opening,
        wherein a sleeve is inserted into a housing of the component at a distance from the fastener and is used for a fastening screw which is also used for fastening to the retainer.

13. The component of claim 12, wherein the projection and the catch pins are molded in one piece onto the housing of the component.

14. The component of claim 13, wherein the projection and the catch pins are made of a fiber-reinforced plastic material.

15. The component of claim 12, wherein the projection and the catch pins are made of a fiber-reinforced plastic material.

16. The component of claim 12, wherein the opening is shaped as an oblong circle.

17. The component of claim 12, wherein the opening is shaped as an oval.

* * * * *